United States Patent [19]
Lane

[11] Patent Number: 5,757,234
[45] Date of Patent: May 26, 1998

[54] FEEDFORWRD DIFFERENTIAL AMPLIFIER

[75] Inventor: Charles D. Lane, Greensboro, N.C.

[73] Assignee: Analog Devices, Inc., Norwood, Mass.

[21] Appl. No.: 642,388

[22] Filed: May 3, 1996

[51] Int. Cl.$^6$ .............................. H03F 3/45; H03M 1/12
[52] U.S. Cl. ..................... 330/256; 330/151; 341/156
[58] Field of Search ........................... 330/151, 252, 330/256, 260; 341/156

[56] References Cited

U.S. PATENT DOCUMENTS

| | | | |
|---|---|---|---|
| 3,548,333 | 12/1970 | Bakke et al. | 330/256 |
| 5,105,194 | 4/1992 | Mizunoue | 341/156 |
| 5,530,444 | 6/1996 | Tice et al. | 330/252 X |
| 5,621,356 | 4/1997 | Philippe | 330/252 |

OTHER PUBLICATIONS

Paul Horowitz, Winfield Hill, *The Art of Electronics*, Cambridge University Press, New York, 1989, pp. 621–622.

*Primary Examiner*—James B. Mullins
*Attorney, Agent, or Firm*—Koppel & Jacobs

[57] ABSTRACT

A residue amplifier includes input and output differential amplifiers. The output differential amplifier includes temperature-dependent current sources which compensate for temperature dependent gain variations within the input differential amplifier. Amplifier components are chosen to produce an overall gain equal to a ratio of fixed resistors, at a nominal temperature. The compensating current sources maintain this fixed gain value as the amplifier's operating temperature varies.

21 Claims, 3 Drawing Sheets

FEEDFORWRD DIFFERENTIAL AMPLIFIER

BACKGROUND OF THE INVENTION

1. Field of the Invention

The invention relates to differential amplifiers and, in particular, to differential amplifiers that may be employed within subranging analog-to-digital converters.

2. Description of the Related Art

Analog-to-digital converters (ADCs) are employed to convert analog, or continuously-variable, "real world" signals (not-withstanding the quantum nature of the real world) into digital signals which are susceptible to manipulation by digital computers. In this context the term "computer" does not refer exclusively to general purpose computers, but includes special processors such as digital signal processors, vector processors, waveform encoders, etc. ADCs are used in audio and video recording and transmission, in RADAR and SONAR detection and analysis, and in process monitoring and control systems, to name just a few of the myriad ADC applications. Many ADC applications, e.g., patient-monitoring medical equipment, require only modest rates of conversion from analog signals to digital signals. Other applications, such as RADAR and video, require much higher conversion rates.

The highest conversion rates attainable are provided by fully parallel, or "flash", ADCs. In one type of flash converter, a bank of comparators is connected to receive an analog signal from an analog input. The signal is distributed to the one input of each comparator within the comparator bank. A resistor ladder connected between voltage references provides reference signals to each comparator's other input. The "rungs" of the resistor ladder are equal-valued resistors which, due to their equal values, provide equal voltage "steps" for comparison with the analog input voltage by the comparators.

An analog input signal that exceeds the voltage at the bottom of the resistance ladder, will trip the bottom-most comparator. An analog input signal that exceeds the voltage at the next-highest ladder rung will trip the two lowest comparators, one that exceeds the voltage at the next highest rung will trip the bottom three comparators, and so on. This comparison process yields what is sometimes referred to as a "thermometer", or "thermometer scale" output at the outputs of the comparator bank. It would be impractical to leave the output in this "thermometer" format; a 20-bit ADC such as may be employed in audio applications would require $2^{20}-1$, i.e., 1,048,575, outputs to represent all the comparator outputs. Therefore a priority encoder is employed to encode the thermometer output into digital values and to latch the digital output.

Any one of several encoding schemes may be used, including off-set binary, 2's complement, sign magnitude, Gray code and binary-coded-decimal(BCD).

The great advantage of a flash converter, such as the one just described, is that the only delays encountered in the conversion process are those attributable to the ladder/ comparator stage and to the encoder. The major disadvantage is the number of resistors and comparators required to implement the converter. Not only do the enormous number of resistors and comparators consume valuable "chip real estate", it is difficult to produce the low-valued resistors required for a monolithic flash converter while maintaining the resistor-matching characteristics required for accurate performance.

For these reasons, the basic parallel ADC architecture just described is employed as a component of other types of ADCs, such as subranging ADCs, which capitalize on the flash converter's speed but also, they substantially reduce the number of resistors and comparators required for conversion. Additionally, due to this reduction in the number of resistors, converters such as subranging converters permit the use of higher-valued resistors, thus easing the resistor-matching task. Flash ADCs and subranging ADCs are discussed in Paul Horowitz, Winfield Hill, *The Art of Electronics*, Cambridge University Press, New York, 1989, pages 621 and 622.

Figure 2:
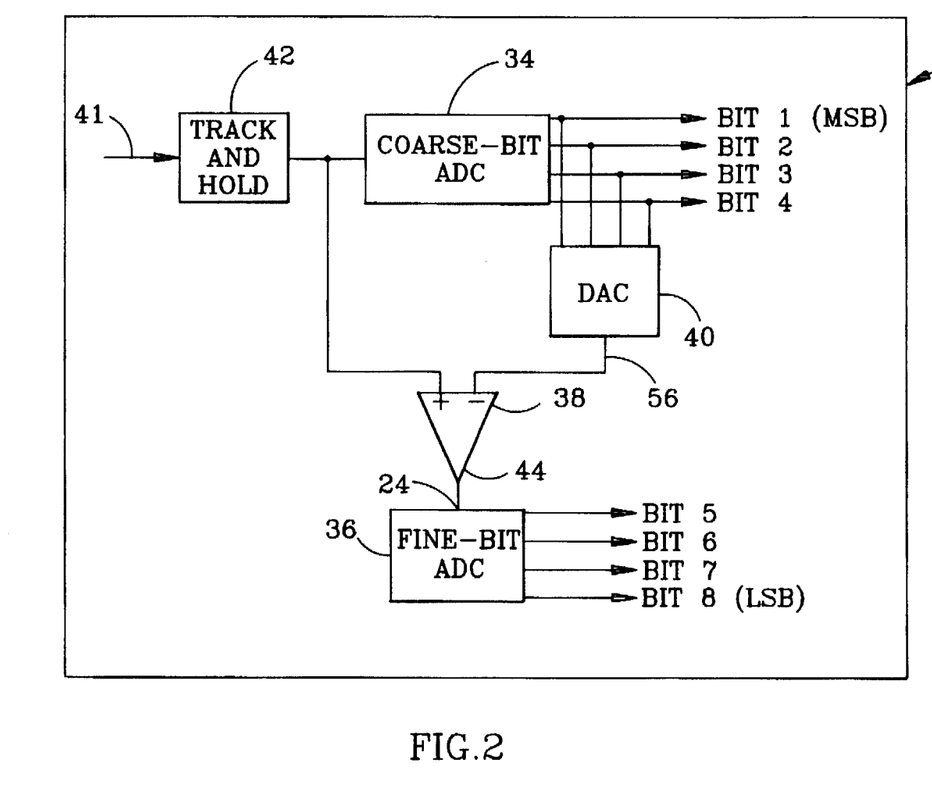
FIG.2 is a block diagram of a subranging ADC such as may employ the new amplifier.

A subranging ADC, as explained in greater detail in the discussion related to FIG.2, captures an analog signal using a track and hold. The track and hold couples the "held" signal to a course bit ADC and a residue amplifier. The course bit ADC provides a digital signal to a DAC which "reconstructs" the original input signal. The DAC couples the reconstructed signal to the residue amplifier which subtracts the reconstructed signal from the held input signal. The residue amplifier feeds the remainder to a fine bit ADC which converts this signal to provide the least significant bits of the subranging ADC. To avoid ADC output errors, the output range of the residue amplifier must match the input range of the fine bit ADC.

Figure 1:
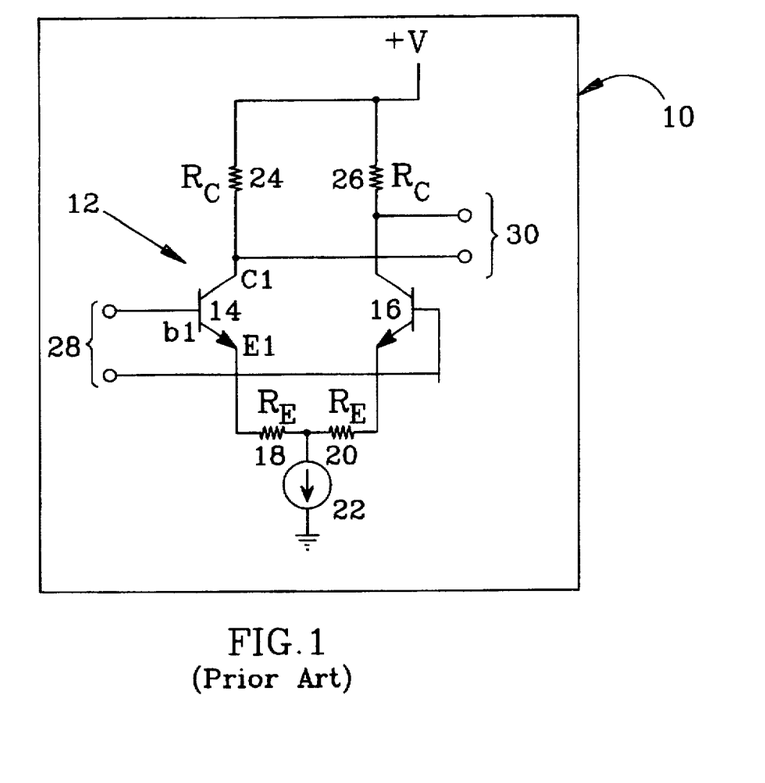
FIG.1 is a schematic diagram of a prior art differential amplifier.

A conventional differential amplifier such as that of FIG.1 is, in some ways, well suited to operate as a subranging ADC's residue amplifier. The differential amplifier 10 includes a differential pair 12 of npn transistors 14 and 16 having their emitters coupled through source resistors 18 and 20, respectively, to a current source 22. The source resistors each have a resistance value RE. The collectors of the transistors are coupled to a supply V+ through collector load resistors 24 and 26, each having a resistance value of RC. The base leads of the two transistors form a differential input port 28 and leads from their collectors form a differential output port 30.

In a first order analysis, a small voltage change vin at the base b1 of the transistor 14 is reflected at its emitter e1. The resultant change in emitter current is vin/RE and the change in voltage at the collector c1 is given by:

$$vo=(vin/RE)\ (RC)$$

The differential voltage gain from the input port 28 to the output port 30, i.e, vo/vin, is therefore approximately equal to RC/RE. Integrated circuit manufacturing is rather inexact at producing specific resistor values but excels at matching resistor ratios. Consequently, this amplifier would seem ideally suited for use as a residue amplifier. Not only would the amplifier's gain be determined by a ratio of resistors, they could, if integrated with the course bit and fine bit ADCs, be formed of the same material as the resistor ladders of the ADCs and would therefore "track" any variation in the ADC resistors'parameters, such as sheet resistivity, from one production run to another.

However, this first order analysis ignores the transistor small signal resistance, i.e., the resistance of the transistor's forward-biased base-emitter junction. Accounting for the small signal resistance yields the following gain expression for this differential amplifier:

$$A=RC/(re+RE)$$

where re is the small signal resistance of the transistor's base emitter junction. Unfortunately, re is highly temperature dependent:

$$re=Vt/I=kT/qI$$

where:

k=Boltzmann's constant q=electron charge

T=temperature K

This temperature dependence leads, naturally, to a temperature dependence in the amplifier's gain. Although some applications may accommodate temperature-dependent gain variations, as noted above, any variation in the residue amplifier's gain and the resulting mismatch between the residue amplifier's output range and the input range of the fine bit ADC could create unacceptable errors in the subranging ADC output. One could control the ADC's environment to eliminate gain mismatches, but this is impractical for most applications. Alternatively, the differential gain may be more accurately set through use of negative feedback which compensates for the temperature dependence of re, but the addition of negative feedback to an amplifier generally is accompanied by frequency compensation circuitry that ensures closed-loop stability at the price of reduced amplifier speed: a critical sacrifice in high-speed converter applications.

SUMMARY OF THE INVENTION

The invention is directed to an amplifier that provides accurate and stable gain without resorting to negative feedback. With the elimination of negative feedback, the new amplifier produces these desirable gain characteristics without sacrificing amplifier speed. The new amplifier may be advantageously employed, for example, in subranging ADCS.

The invention comprises an input differential amplifier coupled by buffer transistors to an output differential amplifier. The input differential amplifier provides a differential current input, a differential voltage input, and a differential voltage output. The differential voltage output is cross coupled by buffer transistors to the differential voltage input of the output differential amplifier. That is, the inverted output of the input differential amplifier is connected, through a buffer transistor, to the noninverted input of the output differential amplifier and the noninverted output of the input differential amplifier is connected through a buffer transistor to the inverted input of the output differential amplifier.

Component values are chosen so that the overall gain, i.e., the product of the input amplifier and output amplifier gains, is equal to a ratio of fixed resistors at a nominal operating temperature. To offset the temperature dependent variation of the amplifier's emitter resistances, current sources connected to the output differential amplifier's emitters are varied inversely with temperature.

These and other features, aspects and advantages of the invention will be apparent to those skilled in the art from the following detailed description, taken together with the accompanying drawings.

DETAILED DESCRIPTION OF THE INVENTION

Flash ADCs are combined in the somewhat slower subranging ADC 32 illustrated in FIG.2. This exemplary embodiment illustrates an eight bit subranging ADC; extension to other resolutions is straightforward. The n-bit(n=8 in this example) subranging ADC 32 combines a coarse-bit ADC 34 and fine-bit ADC 36 using a new residue amplifier 38 and a reconstruction digital-to-analog converter (DAC) 40. The course-bit and fine-bit ADCs are both 1/2n bit (4 bit) ADCs and the reconstruction DAC 40 provides at least n bit (8 bit) accuracy. A track and hold 42 is also employed to combine the four bit ADCs into an eight bit ADC. This subranging architecture significantly reduces the complexity of an ADC. For example, an eight bit flash converter would require 28−1, or 255 comparators and 254 resistors for the resistor ladder (some implementations would allow a reduction in the number of resistors required). The subranging architecture requires only $2(2^4-1)$, or 30 comparators, with a similar reduction in the number of resistors required for the converter.

Analog signals are introduced, at an input 41, to the ADC's track and hold 42 which basically "takes a snapshot" of the analog input signal, which may be varying rapidly. The analog signal thus "held" is coupled to the course-bit ADC 34 and residue amplifier 38. The digital output of the course-bit ADC 34, i.e., outputs BIT 1 through BIT 4, forms the most significant four bits of the ADC. As noted above, the DAC 40 provides at least eight bit conversion accuracy. BIT 1 through BIT 4 from the ADC 34 are coupled to the four inputs (which represent the four most significant of the eight-bit conversion accuracy) of the DAC 40. The DAC 40 which converts this "course" quantization of the input signal into an analog signal. This reconstructed analog signal is fed to the remaining input of the residue amplifier 38, where it is subtracted from the held analog input signal to form a residue signal. The residue signal is applied to the fine-bit ADC 36 which produces the four lower-order outputs, BIT 5 through BIT 8 of the ADC 32.

Figure 3:
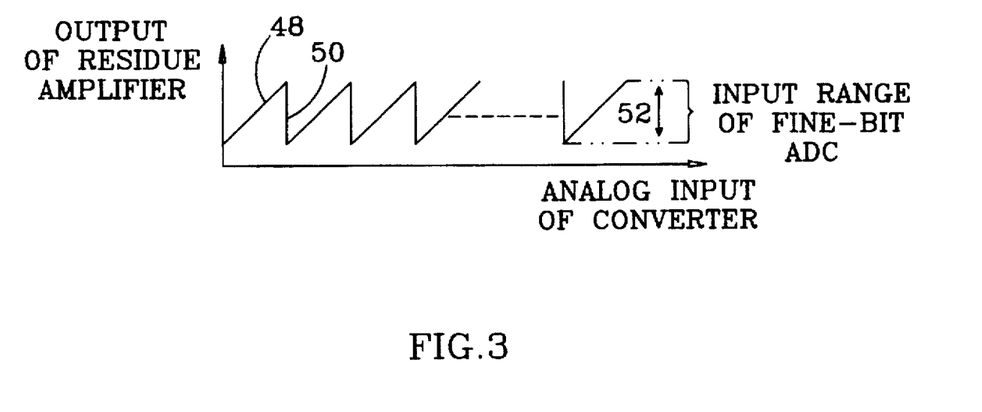
FIG.3 is a diagram of a waveform which illustrates the operation of the residue amplifier and fine bit ADC of FIG.2.

To illustrate the operation of the ADC 32, assume that a ramp signal which extends over the input range of the ADC 32 is applied to the track and hold 42. The output of the residue amplifier 44, which is coupled to the input 24 of the fine bit ADC 36, should match this input signal until the output code of the course bit ADC 34 changes from 0000 to 0001. The ramp signal 48 of FIG.3 illustrates the output of the residue amplifier 44 during this initial period. At the end of this period, the output from the reconstruction DAC 40 will reflect the transition of the fourth most significant bit, bit 4, from 0 to 1, increasing the signal level supplied to the residue amplifier 38 by one step. Since this step reflects a transition of the fourth most significant bit, it will, ideally, equal the highest level output available from the residue amplifier 38 and the input range of the fine-bit ADC36. And, since this signal is subtracted from the held signal by the residue amplifier 38, the input to the fine bit ADC 36 returns along a vertical line 50 to the bottom of its range, which may be zero volts or some offset voltage as shown.

This process continues as the analog input signal at the input 41 increases. The output of the reconstruction DAC 40 increases, step by step, with each increasing code change of the coarse bit ADC 34 so that the output of the residue amplifier 38 forms the sawtooth waveform of FIG.3. In a final conversion period, i.e., as the signal at the input 41 approaches the top of the input range provided by the ADC 32, the output of the residue amplifier increases across the input range 52 of the fine bit ADC as indicated by the ramp signal 48. At the beginning of this period, the output code of the course bit ADC has changed from 1110 to 1111 and the fine bit ADC 36 fills in the remaining least significant four bits, i.e., the final sixteen steps at the uppermost extreme of the output range of the ADC 32. Use of the appellations "residue" amplifier and "reconstruction" DAC are derived from the functions performed by the amplifier 38 and DAC 40 in this exemplary embodiment. The DAC and the amplifier may take many forms.

If the output range of the residue amplifier 38 does not match the input range 24 of the fine bit ADC 36 the ADC 32 exhibit conversion errors. Small mismatches will degrade the linearity of the ADC 32, larger mismatches will create missing codes in the output. In practice, the input range of the fine bit ADC 36 is chosen based upon design criteria such as speed, stability, available sheet resistance, etc. The gain of the residue amplifier 38 is thus determined by the requirement that its output range match the input range of the fine bit ADC 36. As just noted, this matching must be precise in order to avoid the introduction of conversion errors and, as noted in relation to the discussion of FIG.1, because integrated circuit technology excels at matching resistors but is somewhat less adept at creating precise absolute resistor values, it is highly desirable that the gain of a residue amplifier be determined by a ratio of resistors rather than absolute resistor values. Additionally, temperature effects must also be accommodated in order to fix the amplifier's gain at a desired value.

The input range of the ADC 36 is determined by resistor ratios and is therefore insensitive to temperature variations. Additionally, because all the resistors are of the same material, variations in sheet resistivity due, for example, to process variations from one "production run" to another, will have no effect on input range either. Since the input range of the ADC 36 is invariant in this manner, the output range of the residue amplifier 38 must also be invariant. To achieve this gain invariance, the gain of a first stage of the preferred residue amplifier is, to a first approximation, based upon a ratio of resistors having the same sheet resistivity as those used in the ADC 36. The amplifier's second stage compensates for temperature-induced gain variations in the first stage, without requiring the use of feedback for stability.

Figure 4:
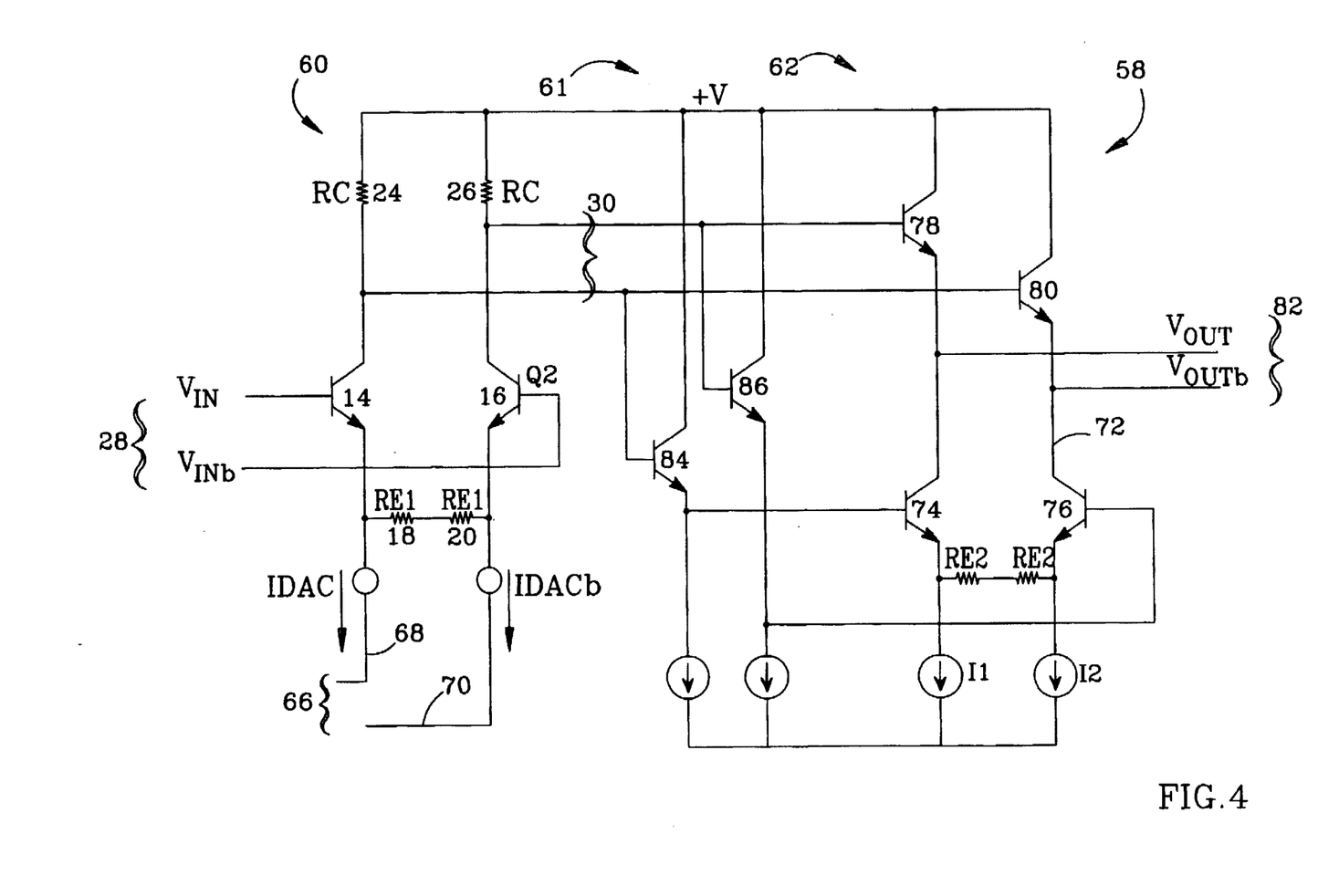
FIG.4 is a schematic diagram of a preferred embodiment of the new amplifier.

FIG.4 is a schematic diagram of a new differential amplifier 58 which includes input 60 and output 62 differential amplifiers that are separated by a broken partition line 64. The input amplifier 60 is similar to the differential amplifier 10 of FIG.1 with like elements indicated by like reference numbers. However, the differential amplifier 58 includes a differential current input port 66 which is coupled to the emitters of transistors 14 and 16 with a resistance of 2RE, emitter degeneration resistors 18 and 20, connected across the port. Since the reconstruction DAC 40 of FIG.2 typically employs a series of switched current sources and provides a differential current output 56, the input amplifier 60 is particularly suited to this application. When used as a residue amplifier, the input port 66 receives a differential current signal IDAC (the difference between IDAC and IDACb) from the output 56 of the reconstruction DAC 40 of FIG.2 and the input port 28 receives a differential voltage signal from the track and hold 42. This connection terminates the typically high output capacitance of a segmented DAC in the low impedance of the emitters of transistors 14 and 16. Thus, the settling time for DAC signals coupled to the input port 66 is lower than it would be if, for example, the DAC output were coupled to the high impedance collector nodes of transistors 14 and 16.

In operation as a residue amplifier, the amplitude of IDAC varies from zero to a full scale current value IFS. When the input signal to the subranging ADC 32 of FIG.2 is at the bottom of the converter's input range, e.g., at the bottom of the ramp voltage 48 in FIG.3, IFS will flow in the upper arm 68 of the port 66 and current in the lower arm 70 will be zero. Currents in these arms change in opposite steps in response to code changes of the course bit ADC 34 until the current in the upper arm 68 is zero and that in the lower arm 70 equals IFS when the converter's input voltage is at the top of its range, e.g., at the end of the ramp 48 in FIG.3. Since the differential inputs VIN and VINb are supplied by the track and hold 42, they will track, to a close approximation, the output of the DAC 40.

The output amplifier 62 includes a differential pair 72 of transistors 74 and 76. The emitters of the transistors 74 and 76 are coupled to current sources I1 and I2 respectively. The collectors of the transistors are coupled to a supply voltage V+ by emitter follower transistors 78 and 80. The bases of the emitter followers 78 and 80 are coupled to the collectors of transistors 16 and 14, respectively. Leads from the emitters of the emitter followers form a differential output port 82. The emitter followers 78 and 80 couple the differential output signal from output port 30 to the output port 82. The bases of differential transistors 74 and 76 are connected to the supply voltage V+ through emitter followers 84 and 86, respectively.

The emitter followers 84 and 86 act as unity gain buffer transistors and their bases are connected to the collectors of transistors 14 and 16, respectively.

Using the same analysis as for the amplifier of FIG.1, assuming IDAC=IFS/2, the gain of the input amplifier 60 is given by the expression:

$$Ain = RC/(RE1+re14)$$

where:

$Ain$ = input amplifier gain
$RC$ = resistance of collector load resistors 24 and 26
$Re1$ = emitter resistor
$RE14$ = emitter resistance of transistor 14
  = $Vt/IDAC$
  = $kT/qIDAC$ Differential voltage and current signals at input ports 28 and 66 respectively, will each be amplified by Ain and superposed, one on top of the other. As noted above, the emitter resistance re14 is temperature-dependent and, consequently, the gain Ain will vary with temperature. The output amplifier 62 compensates for the temperature variation of the input amplifier's gain Ain without the use of feedback and, consequently, the speed of the residue amplifier 58 is not diminished as it would be if feedback were used.

Figure 5:
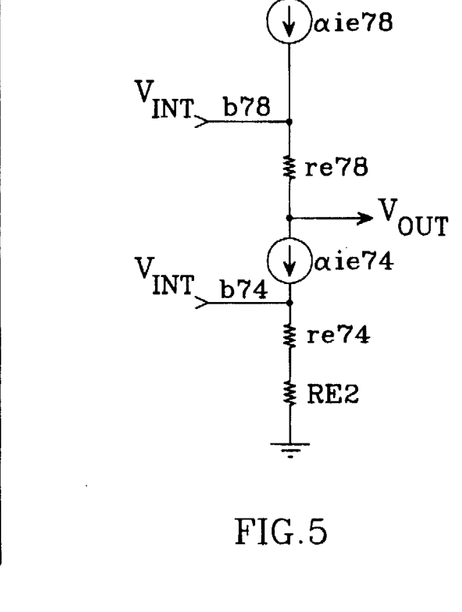
FIG.5 is a small signal model of a portion of the output stage of the preferred embodiment of FIG.4.

The overall gain Ara of the residue amplifier 58 is the product of the input and output amplifier gains. The gain of the output amplifier may be determined, neglecting base currents and using the same small signal approach as in determining the gain of the input amplifier. Assuming symmetry, the voltage VOUT at the output port 82 may be derived from the equivalent circuit of FIG.5. Using a small signal transistor model, current sources ie78 and ie74 in series with emitter resistances re78 and re74 are substituted for transistors 78 and 74, respectively. The intermediate differential voltage signals, VINT and −VINT are presented to the respective bases b78 and b74 of the transistors 78 and 74. The voltage VOUT at the output port 82 is therefore:

$$VOUT = VINT - (re78)(Ie78)$$

where:

VINT=the intermediate voltage, at the input of the output amplifier re78=transistor 78 emitter resistance Ie78=transistor 78 emitter current and $$\begin{aligned}
Ie74 &= Ie78 \\
&= (-VINT)/(re74 + RE2) \\
VOUT &= VINT - Ie78\,re78 \\
&= VINT - (-VINT/(re74 + RE2))(re78)
\end{aligned}$$

therefore:

$$\begin{aligned}
AOUT &= VOUT/VINT \\
&= [1 + re78/(re74 + RE2)]
\end{aligned}$$

where:

AOUT=gain of the output amplifier re78=emitter resistance of transistor 78 re74=emitter resistance of transistor 74

RE2=resistance of emitter resistor and the residue amplifier gain Ara is therefore:

$$\begin{aligned}
Ara &= (AIN)(AOUT) \\
&= [RC/(re14 + RE1)][1 + re78/(re74 + RE2)]
\end{aligned}$$

The object of the second stage is to compensate for temperature dependent changes in re14. Because of integrated circuit manufacturing's proficiency at matching resistor ratios, it would be highly desirable that the overall amplifier gain be set by a ratio of fixed resistors, such as RC/RE1. Given that the amplifier's overall gain may be expressed as:

$$Ara = [RC/(re14+RE1)][1+re78/(re74+RE2)],$$

the design objective may be expressed as a requirement that AOUT satisfy the following relation:

$$\begin{aligned}
RC/RE1 &= [AOUT][RC/(re14 + RE1)] \\
\text{or} \\
AOUT &= [RC/RE1][(RE1 + re14)/RC] \\
&= (RE1 + re14)/RE1
\end{aligned}$$

Substituting the expression for the gain of the output differential amplifier, one obtains the following expression of the design objective:

$$[1+re78/(re74+RE2)]=(RE1+re14)/RE1$$

This condition may be satisfied by setting re74=Ara(re14) and RE2=Ara(RE1)−(re74). Recognizing that re74=re78 and substituting for re74, re78 and RE2 in the above expression, one obtains:

$$\begin{aligned}
AOUT &= [1 + re78/(re74 + RE2)] \\
&= \{1 + Ara(re14)/[(Ara(re14) + Ara(RE1) - Ara(re14)]\} \\
&= (1 + re14/RE1) \\
&= (RE1 + re14)/RE1
\end{aligned}$$

That is, with re74=Ara(re14) and RE2=Ara(RE1)−(re74), the design objective is satisfied. In practice, re74 is set approximately equal to Ara(re14) by setting the current source I1 (and I2) approximately equal to IDAC/Ara. The value of the fixed resistor RE2 is determined at a nominal operating temperature and, since re74 varies with temperature, I1 is varied to compensate for temperature-dependent changes in re74.

An implementation of the new amplifier would proceed as follows. The target gain Ara is determined by external considerations, such as matching the output range of the amplifier to the input range of a fine bit ADC in a subranging ADC implementation. The current drawn from the input amplifier IDAC is also determined by external factors such as the resolution and range of the reconstruction DAC. Collector and emitter resistors RC and RE1 are chosen to provide the desired amplifier gain Ara. I1 is set equal to IDAC/Ara and RE2 is chosen to be equal to AraRE1−re74n, where re74n is the value of re74 at a nominal operating temperature with I1 equal to IDAC/Ara. Then, to compensate for temperature-dependent changes in re74, an offsetting temperature-dependent current component is included in I1, KT/(qRE2).

For example, suppose that the design criteria were as follows:

Ara=3

IDAC=1.55 mA

The ratio RC/RE1 is set equal to 3 by choosing a 480 Ohm resistor for RC and a 160 ohm resistor for RE1. Since IDAC=1.55 mA, I1 is set equal to IDAC/Ara=517 µA. A nominal operating temperature, 300 K in this example, is chosen and the nominal emitter resistance is derived from the expression re74n=K T/qI1), which yields re74n=50 ohm. The second stage emitter resistor RE2 is set equal to AraRE1−re74n=430 ohm.

The current through the load resistor 26, that is the collector current ic16, is equal to αie16 and αie16=VINb/(re16+RE1), therefore:

$$ic16 = \alpha VINb/(re16+RE1)$$

Since the intermediate signal VINT is developed by the flow of collector current ic16 through the load resistor 26, VINT also varies with α. The difference between emitter and collector currents of the transistor 16 may be considered an error current: ierr=ie16−ic16

$$\begin{aligned}
ierr &= ie16 - ic16 \\
&= (1 - \alpha)VINb/(re16 + RE1)
\end{aligned}$$

This error term is compensated for, or corrected, by the base current ib78 of transistor 78 which is approximately equal to the base current of transistor 74. The base current ib74 of transistor 74 is given by:

$$ib78 = ib74 = (1-\alpha)(-VINT)/(re78 + RE2)$$
$$= (1-\alpha)(-VINT)/[re78 + (Ara)(RE1) - re78]$$
$$= (1-\alpha)(-VINT)/[(Ara)(RE1)]$$

Substituting VINbRC/(RE1+re16) for −VINT in the above equation yields:

$$ib78 = (1-\alpha)[(VINbRC)/(RE1 + re16)]/(AraRE1)$$
$$= (1-\alpha)[(VINbRC)/(RE1 + re16)]/[(RC/RE1)RE1]$$
$$= (1-\alpha)[(VINb)/(RE1 + re16)]$$

That is, ib78=ierr and, at the nominal temperature, base currents are compensated for.

The forgoing description of specific embodiments of the invention has been presented for the purposes of illustration and description. It is not intended to be exhaustive or to limit the invention to the precise forms disclosed, and many modifications and variations are possible in light of the above teachings.

For example, a subranging ADC employing the novel residue amplifier could employ one flash ADC for both the course bit and fine bit ADC functions instead of the two illustrated, by switching the input of the flash ADC between the analog input and the output of the residue amplifier. A subranging ADC may also incorporate registers at the outputs of the fine bit and course bit ADCs, an analog delay between the track and hold and the fine bit ADC, and a strobe circuit connected to allow each element to settle to its optimum point before conversion. Instead of using the npn transistors illustrated, pnp transistors could be substituted. Although the amplifier is particularly suited for application in a subranging ADC, it may be employed in any of a number of suitable amplifier applications. An additional benefit of the new amplifier is the output differential amplifier's compensation of temperature-dependent variations in transistor current gain within the input differential amplifier.

The embodiments were chosen and described in order to best explain the principles of the invention and its practical application, to thereby enable others skilled in the art to best utilize the invention. It is intended that the scope of the invention be limited only by the claims appended hereto.

I claim:

1. A differential amplifier, comprising:
    a first amplifier stage comprising:
        a first pair of transistors connected to amplify a differential input voltage to produce a first stage output voltage, and
        a gain setting resistance circuit including a plurality of resistors connected to said first pair of transistors to establish a nominal first stage amplifier gain as a function of resistances within said circuit, and
    a second amplifier stage comprising:
        a second pair of transistors connected to amplify the first stage output voltage,
        a second gain setting resistance circuit including a plurality of resistors connected to said second pair of transistors to establish a nominal second stage amplifier gain as a function of resistances within said circuit, and
        a plurality of temperature dependent current sources which are connected to said second pair of transistors and said second resistance circuit and produce currents which vary with temperature to compensate for temperature dependent variations in the overall gain of said first and second stages, without feedback from the second stage to the first stage.

2. The differential amplifier of claim 1, wherein said first pair of transistors are further connected to amplify a differential input current.

3. The differential amplifier of claim 2, wherein said amplifier is characterized by a fixed, target gain At, said first pair of transistors and gain setting resistor circuit form an input differential amplifier having differential voltage and current inputs and an intermediate differential voltage output, the gain of said input differential amplifier being equal to RC/(RE1+re1), where RC and RE1 are fixed resistor values, with RC/RE1 equal to At, and re1 is the value of the emitter resistance of each transistor of said first transistor pair, and said second pair of transistors and gain setting resistor circuit form an output differential amplifier having control and current circuit inputs for said second pair of transistors connected to receive the intermediate differential voltage output of said input differential amplifier through respective pairs of buffer transistors, the gain of said output differential amplifier being equal to [1+re3/(re5+RE2)] where RE2 is a fixed resistor equal to At(RE1−re1n), where re1n is the value of re1 at a predetermined temperature, re3 is the emitter resistance of the second pair of transistors, re5 is the emitter resistance of the buffer transistors for the current circuits of the second pair of transistors and Atre1 equals re3 and re5 at said predetermined temperature.

4. The feedforward differential amplifier of claim 3, wherein said predetermined temperature is a nominal operating temperature.

5. The feedforward differential amplifier of claim 4, wherein said output differential amplifier further comprises a current source producing a current of value I1 connected to control the resistance re3 according to the relationship I1=KT/gre3n, where K is Boltzmann's constant, q is the electron charge, T is the temperature Kelvin and re3n is the value of re3 at said nominal operating temperature.

6. The feedforward differential amplifier of claim 5, wherein said output differential amplifier current source equals said input differential amplifier input current divided by said amplifier gain.

7. A feedforward differential amplifier characterized by a fixed target gain At, with voltage and current input ports and a voltage output port, comprising:
    an input differential amplifier comprising an input differential pair of transistors that each have current circuits with first and second current terminals which are responsive to a control terminal and resistances associated with their current circuits which vary with temperature, said differential pair of transistors having their control terminals coupled to said voltage input port, their first current terminals coupled to said current input port, and their second current terminals connected through respective load resistors to a supply voltage, said second current terminals forming an intermediate differential voltage output, and
    an output differential amplifier including output current sources and an output differential pair of transistors that each have first and second current terminals which are responsive to respective control terminals, each transistor in said output differential pair having one of its current terminals connected to a respective one of said current sources and its remaining current terminal coupled to a voltage output port, said remaining current terminals also connected through respective coupling paths to said intermediate differential voltage output, said output current sources varying with temperature to compensate for temperature induced changes in said input transistor current circuit resistances to temperature stabilize the overall amplifier gain without feedback from the output to the input differential amplifier.

8. The feedforward differential amplifier of claim 7, further comprising emitter degeneration resistors each having a resistance RE1 connected between said first current terminals, respectively, and said current input port, said load resistors each having resistance a RC, with the ratio RC/RE1 equaling the fixed target gain At of the feedforward amplifier.

9. The feedforward differential amplifier of claim 8, further comprising additional emitter degeneration resistors each having a resistance RE2 equal to AtRE1−KTn/(qI1), where K is Boltzmann's constant, q is the electron charge, Tn is a predetermined temperature and the value of I1 is equal to said input current divided by the amplifier gain, connected between said output current sources.

10. The feedforward differential amplifier of claim 9, wherein said remaining current terminals of said output transistor are coupled to said intermediate voltage output through respective emitter follower buffer transistors, and the gain of said output differential amplifier equals [1+re3/(re5+−RE2)], where RE2 is a fixed resistor equal to At(RE1−re1n), re1 is the value of the emitter resistance of each the transistors of said first transistor pair, re1n is the value of re1 at a predetermined temperature, re3 is the emitter resistance of said output transistors, re5 is the emitter resistance of said buffer transistors and Atre1 equals re3 and re5 at said predetermined temperature.

11. The feedforward differential amplifier of claim 10, wherein the current produced by each of said output current sources is approximately equal to said input differential amplifier input current divided by said amplifier target gain.

12. The feedforward differential amplifier of claim 11, wherein the current produced by each of said output current sources is approximately equal to IDAC(RE1/RE2)−(kT/qRE2), where IDAC is said input differential amplifier input current.

13. The feedforward differential amplifier of claim 12, wherein re1 equals KT/q divided by said input differential amplifier input current and K is Boltzmann's constant, q is the electron charge, T is the temperature Kelvin.

14. A feedforward differential amplifier, comprising:
an input amplifier having differential voltage and current inputs and a differential voltage output, the gain of said input amplifier being temperature dependent, and
an output amplifier having a differential voltage input connected to receive the differential voltage output from said input amplifier, the product of the gains of said input and output amplifiers being a function of fixed resistances at a predetermined operating temperature, said output amplifier further comprising a temperature dependent current source which modifies the gain of said output amplifier such that the product of the input and output amplifier gains remains approximately equal to said function of fixed resistances as the temperature of said input and output amplifiers vary, without feedback from said output amplifier to said input amplifier.

15. A subranging analog to digital converter, comprising:
a track and hold connected to track and hold an analog signal,
an n-bit course-bit analog to digital converter connected to receive a held analog signal from said track and hold, and to provide the n most significant bits of said subranging analog to digital converter output,
an n-bit digital to analog converter connected to convert the output of said course bit analog to digital converter to a reconstructed analog output signal,
a residue amplifier connected to receive said reconstructed analog output signal and said held analog signal and to produce an output signal equal to the difference between said reconstructed and held analog signals amplified by the gain of said residue amplifier, the residue amplifier characterized by a fixed target gain At and having voltage and current input ports and a voltage output port, and
a m-bit analog to digital converter connected to convert said residue amplifier output signal, thereby providing the m least significant bits of said subranging analog to digital converter, said residue amplifier comprising:
an input differential amplifier comprising an input differential pair of transistors that each have current circuits with first and second current terminals which are responsive to a control terminal and resistances associated with their current circuits which vary with temperature, said differential pair of transistors having their control terminals coupled to said voltage input port, their first current terminals coupled to said current input port, and their second current terminals connected through respective load resistors to a supply voltage, said second current terminals forming an intermediate differential voltage output, and
an output differential amplifier including output current sources and an output differential pair of transistors that each have first and second current terminals which are responsive to respective control terminals, each transistor in said output differential pair having one of its current terminals connected to a respective one of said current sources and its remaining current terminal coupled to a voltage output port, said remaining current terminals also connected through respective coupling paths to said intermediate differential voltage output, said output current sources varying with temperature to compensate for temperature induced changes in said input transistor current circuit resistances to temperature stabilize the overall amplifier gain without feedback from the output to the input differential amplifier.

16. The subranging analog to digital converter of claim 15, further comprising emitter degeneration resistors each having a resistance RE1 connected between said first current terminals, respectively, and said current input port, said load resistors each having resistance a RC, with the ratio RC/RE1 equaling the fixed target gain At of the feedforward amplifier.

17. The subranging analog to digital converter of claim 16, wherein said remaining current terminals of said output transistor are coupled to said intermediate voltage output through respective emitter follower buffer transistors, and the gain of said output differential amplifier equals [1+re3/(re5+RE2)], where RE2 is a fixed resistor equal to At(RE1−re1n), re1 is the value of the emitter resistance of each the transistors of said first transistor pair, re1n is the value of re1 at a predetermined temperature, re3 is the emitter resistance of said output transistors, re5 is the emitter resistance of said buffer transistors and Atre1 equals re3 and re5 at said predetermined temperature.

18. The subranging analog to digital converter of claim 17, wherein the current produced by each of said output current sources is approximately equal to said input differential amplifier input current divided by said amplifier target gain.

19. The subranging analog to digital converter of claim 18, wherein the current produced by each of said output current sources is approximately equal to IDAC(RE1/RE2) −(kT/qRE2), where IDAC is said input differential amplifier input current.

20. The subranging analog to digital converter of claim 17, wherein re1 equals KT/q divided by said input differential amplifier input current and K is Boltzmann's constant, q is the electron charge, T is the temperature Kelvin .

21. A differential amplifier, comprising:

a differential input stage having a pair of input transistors with emitter resistances that vary with temperature, and a differential output stage connected to receive an input from said input stage and having a pair of output transistors with emitter resistances that also vary with temperature, and a pair of current sources that are connected to induce current flows through said output transistors that vary with temperature to compensate for temperature induced variations in said input and output transistor emitter resistances, so as to yield an amplifier gain that is substantially independent of temperature without feedback from said output stage to said input stage.

\* \* \* \* \*

UNITED STATES PATENT AND TRADEMARK OFFICE
CERTIFICATE OF CORRECTION

PATENT NO. : 5,757,234
DATED : May 26, 1998
INVENTOR(S) : Charles D. Lane

It is certified that error appears in the above-identified patent and that said Letters Patent is hereby corrected as shown below:

On the cover page, in the title: delete "FEEDFORWRD" and substitue --FEEDFORWARD--.

Column 1, line 1, delete "FEEDFORWRD" and substitute --FEEDFORWARD--.

Signed and Sealed this

First Day of September, 1998

Attest:

BRUCE LEHMAN

Attesting Officer

Commissioner of Patents and Trademarks